(12) United States Patent
Ogawa et al.

(10) Patent No.: US 8,378,417 B2
(45) Date of Patent: Feb. 19, 2013

(54) SEMICONDUCTOR DEVICE INCLUDING A WELL POTENTIAL SUPPLY DEVICE AND A VERTICAL MOS TRANSISTOR

(75) Inventors: Kazuo Ogawa, Tokyo (JP); Yoshihiro Takaishi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 96 days.

(21) Appl. No.: 12/662,127

(22) Filed: Mar. 31, 2010

(65) Prior Publication Data

US 2010/0252879 A1    Oct. 7, 2010

(30) Foreign Application Priority Data

Apr. 2, 2009    (JP) ................ P2009-090456

(51) Int. Cl.
| | |
|---|---|
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |
| H01L 29/423 | (2006.01) |
| H01L 29/74 | (2006.01) |
| H01L 31/111 | (2006.01) |
| H01L 27/148 | (2006.01) |
| H01L 29/768 | (2006.01) |

(52) U.S. Cl. ........ 257/329; 257/135; 257/136; 257/242; 257/328; 257/331; 257/401; 257/E21.41; 257/E27.096; 257/E29.118; 257/E29.183; 257/E29.262; 257/E29.274; 257/E29.313; 257/E29.318

(58) Field of Classification Search .............. 257/135, 257/136, 242, 328, 329, 331, 401, E21.41, 257/E27.096, E29.118, E29.183, E29.262, 257/E29.274, E29.313, E29.318

See application file for complete search history.

(56) References Cited

U.S. PATENT DOCUMENTS

| | | | | |
|---|---|---|---|---|
| 5,382,816 | A * | 1/1995 | Mitsui ............................ | 257/266 |
| 5,872,037 | A * | 2/1999 | Iwamatsu et al. ............. | 438/268 |
| 6,013,548 | A * | 1/2000 | Burns et al. .................... | 438/242 |
| 6,064,099 | A | 5/2000 | Yamada et al. ................ | 257/372 |
| 6,373,099 | B1 * | 4/2002 | Kikuchi et al. ................ | 257/331 |
| 6,528,356 | B2 * | 3/2003 | Nemati et al. ................ | 438/135 |
| 6,610,575 | B1 * | 8/2003 | Ang et al. ...................... | 438/275 |
| 6,841,438 | B2 * | 1/2005 | Bissey et al. .................. | 438/212 |
| 6,853,023 | B2 * | 2/2005 | Goebel et al. ................. | 257/301 |
| 6,943,407 | B2 * | 9/2005 | Ouyang et al. ................ | 257/329 |
| 7,528,035 | B2 * | 5/2009 | Cheng ........................... | 438/243 |
| 7,528,439 | B2 * | 5/2009 | Tang et al. ..................... | 257/327 |

(Continued)

FOREIGN PATENT DOCUMENTS

| | | |
|---|---|---|
| JP | 2000-124450 | 4/2000 |
| JP | 2008-300623 | 12/2008 |

*Primary Examiner* — Ida M Soward
(74) *Attorney, Agent, or Firm* — McGinn IP Law Group, PLLC

(57) ABSTRACT

A semiconductor device includes a semiconductor substrate; a well of a first conductivity type in the semiconductor substrate; a first element; and a first vertical transistor. The first element supplies potential to the well, the first element being in the well. The first element may include, but is not limited to, a first pillar body of the first conductivity type. The first pillar body has an upper portion that includes a first diffusion layer of the first conductivity type. The first diffusion layer is greater in impurity concentration than the well. The first vertical transistor is in the well. The first vertical transistor may include a second pillar body of the first conductivity type. The second pillar body has an upper portion that includes a second diffusion layer of a second conductivity type.

20 Claims, 8 Drawing Sheets

U.S. PATENT DOCUMENTS

| | | | |
|---|---|---|---|
| 7,646,041 B2 * | 1/2010 | Chae et al. | 257/204 |
| 7,772,632 B2 * | 8/2010 | Haller et al. | 257/296 |
| 7,910,971 B2 * | 3/2011 | Lindholm et al. | 257/296 |
| 8,053,817 B2 * | 11/2011 | Cha | 257/238 |
| 2002/0060344 A1 * | 5/2002 | Auerbach et al. | 257/368 |
| 2004/0259312 A1 * | 12/2004 | Schlosser et al. | 438/270 |
| 2007/0075359 A1 * | 4/2007 | Yoon et al. | 257/329 |
| 2007/0166914 A1 * | 7/2007 | Chen et al. | 438/243 |
| 2008/0093644 A1 * | 4/2008 | Forbes | 257/296 |
| 2008/0296677 A1 | 12/2008 | Takaishi | 257/336 |
| 2009/0148992 A1 * | 6/2009 | Oyu | 438/268 |
| 2010/0213539 A1 * | 8/2010 | Masuoka et al. | 257/329 |
| 2010/0224924 A1 * | 9/2010 | Ellis et al. | 257/300 |
| 2011/0233512 A1 * | 9/2011 | Yang et al. | 257/9 |

* cited by examiner

US 8,378,417 B2

SEMICONDUCTOR DEVICE INCLUDING A WELL POTENTIAL SUPPLY DEVICE AND A VERTICAL MOS TRANSISTOR

BACKGROUND OF THE INVENTION

1. Field of the Invention

The present invention relates to a semiconductor device and a method of forming the same. Particularly, the present invention relates to a semiconductor device including a well potential supply device and a vertical MOS transistor, and to a method of forming the same.

Priority is claimed on Japanese Patent Application No. 2009-090456, filed Apr. 2, 2009, the content of which is incorporated herein by reference.

2. Description of the Related Art

In forming a semiconductor device having a CMOS circuit configuration using a MOS transistor, a semiconductor substrate of one conduction type is provided with a well of a conduction type different from that of the semiconductor substrate therein, and an N- or P-type MOS transistor is arranged in the well.

At this time, the potential of the well is in a floating state, and in order to prevent an erroneous operation of the semiconductor device, a well potential fixing contact plug is connected to the well to feed a predetermined potential (Japanese Unexamined Patent Application Publication No. 2000-124450).

Japanese Unexamined Patent Application, First Publication, No. 2008-300623 discloses that in recent years, with advancement of miniaturization of semiconductor devices, instead of a known planar MOS transistor, a vertical MOS transistor including a pillar (columnar) body region (channel region) has been developed.

In the case of a CMOS circuit configuration using a vertical MOS transistor, it is also necessary to form a well and to fix the well potential.

SUMMARY

In one embodiment, a semiconductor device may include, but is not limited to, a semiconductor substrate; a well of a first conductivity type in the semiconductor substrate; a first element; and a first vertical transistor. The first element supplies potential to the well, the first element being in the well. The first element may include, but is not limited to, a first pillar body of the first conductivity type. The first pillar body has an upper portion that includes a first diffusion layer of the first conductivity type. The first diffusion layer is greater in impurity concentration than the well. The first vertical transistor is in the well. The first vertical transistor may include a second pillar body of the first conductivity type. The second pillar body has an upper portion that includes a second diffusion layer of a second conductivity type.

In another embodiment, a semiconductor device may include, but is not limited to, a semiconductor substrate; a well of a first conductivity type in the semiconductor substrate; a buried insulating layer in the semiconductor substrate; an active region in the well; a first element; and a first vertical transistor. The active region is defined by the buried insulating layer. The first element supplies potential to the well. The first element is in the active region. The first element may include a first pillar body of the first conductivity type. The first pillar body extends upwardly from the well. The first vertical transistor is in the active region. The first vertical transistor may include a second pillar body of the first conductivity type. The second pillar body extends upwardly from the well.

In still another embodiment, a method of forming a semiconductor device may include, but is not limited to, the following processes. A well of a first conductivity type is formed in a semiconductor substrate. A buried insulating layer is formed in the semiconductor substrate. The buried insulating layer defines an active region in the semiconductor substrate. The well is selectively etched to form a first pillar body of the first conductivity type and a second pillar body of the first conductivity type in the well. A first diffusion layer of the first conductivity type is formed in an upper portion of the first pillar body to form a first element that supplies potential to the well. The first diffusion layer is greater in impurity concentration than the well. A second diffusion layer of a second conductivity type is formed in an upper portion of the second pillar body to form a first vertical transistor in the well.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Before describing the present invention, the related art will be explained in detail with reference to FIGS. 16 and 17, in order to facilitate the understanding of the present invention.

When a vertical MOS transistor is used, the inventors have found that, if potential is fed through a contact plug for use in a known planar transistor so as to fix the well potential, the following problem emerges.

Hereinafter, this issue will be described with reference to FIGS. 16 and 17. FIG. 16 is a plan view showing the arrangement of a vertical MOS transistor and a well potential fixing contact plug. FIG. 17 is a sectional view taken along the line B-B' of FIG. 16.

Figure 16:
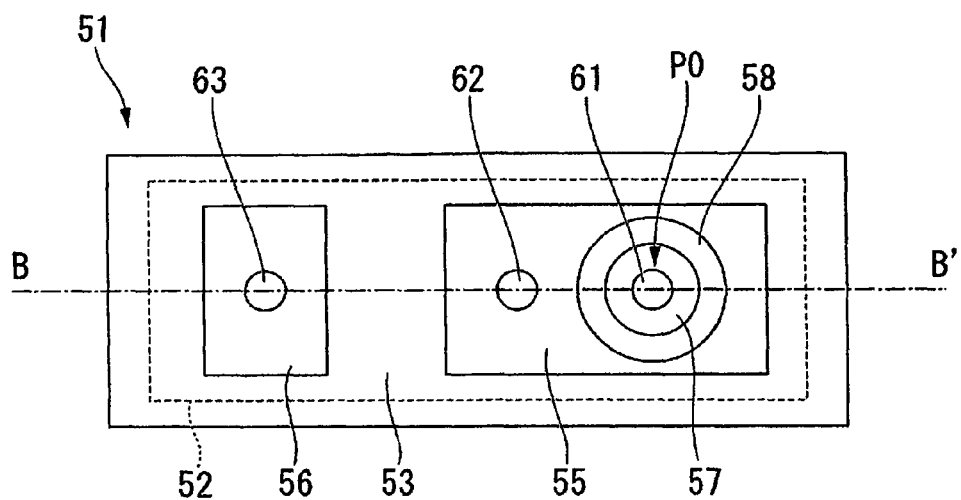
FIG. 16 is a plan view showing the arrangement of a vertical MOS transistor and a well potential fixing contact plug.
Figure 17:
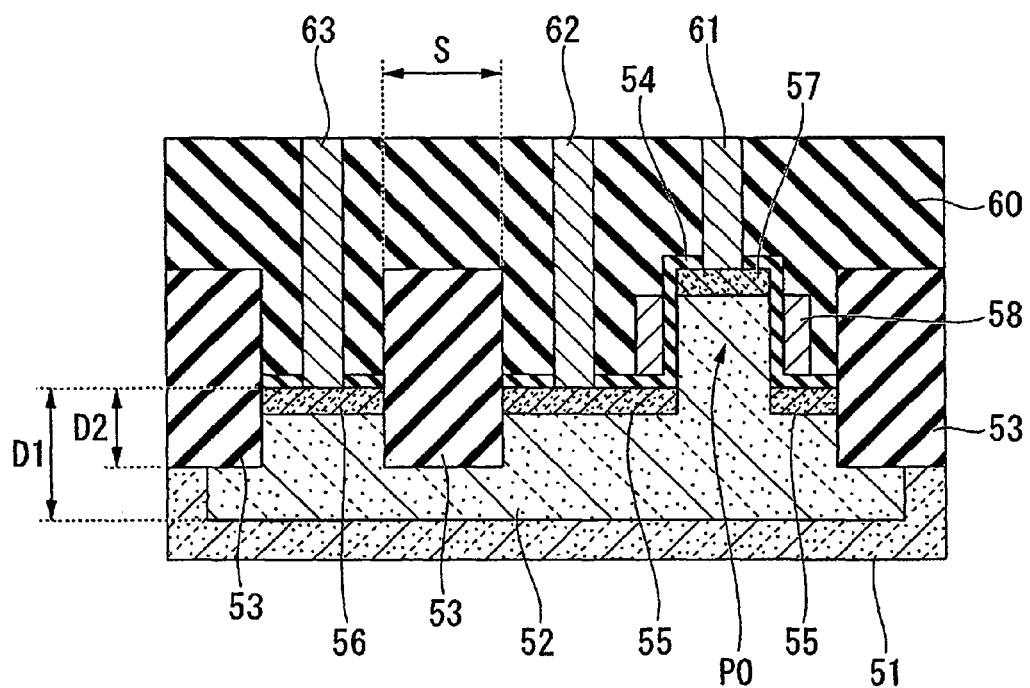
FIG. 17 is a cross sectional elevation view taken along the line B-B' of FIG. 16.

Referring to FIGS. 16 and 17, the configuration will be described in which an N-type well is formed in a P-type semiconductor substrate, and a P-type vertical MOS transistor is arranged in the N-type well.

A P-type semiconductor substrate 51 is provided with a device isolation region 53 and an N-type well 52. The device isolation region 53 partitions active regions 55 and 56, and the active regions are arranged inside the N-type well 52. The pillar part P0 includes the body region of the vertical MOS transistor, and is formed by etching the N-type well 52 of the active region in the shape of a pillar. A gate insulating film 54 is formed so as to cover the surface of the pillar part P0. A gate electrode 58 is formed so as to surround the side surface of the pillar part P0 and to be opposite the surface of the body region with the gate insulating film 54 interposed between them. A P-type impurity diffusion layer 55 performs function as a source or a drain of a transistor. A P-type impurity diffusion layer 57 is provided at the upper part of the pillar part P0 so as to function as a drain or a source. The inside of the pillar part P0 is connected to the N-type well 52. An insulating interlayer 60 is formed so as to cover the pillar part P0. Contact plugs 61 and 62 are respectively connected to the P-type impurity diffusion layers 55 and 57, and supply potential to the source or the drain. A contact plug for supplying potential to the gate electrode 58 is not shown.

A contact plug 63 is provided in a region adjacent to the vertical MOS transistor so as to fix the potential of the N-type well, and is connected to the N-type impurity diffusion layer 56. The N-type impurity diffusion layer 56 is formed by implanting a high concentration of an N-type impurity into the active region of the N-type well partitioned by the device isolation region 53. The concentration of the N-type impurity diffusion layer 56 is higher than the concentration of the N-type well, such that contact resistance between the contact plug and the surface of the N-type well is reduced.

A semiconductor device having such arrangement has the following problems.

First, in order to fix the well potential, it is necessary to arrange the impurity diffusion layer 56, which is formed by implanting an impurity of the same conduction type as the conduction type of the well with a high concentration, so as to be adjacent to the vertical MOS transistor. Meanwhile, the impurity diffusion layer 56 has a conduction type opposite to the impurity diffusion layer region for forming the source and drain of the vertical MOS transistor, so it is necessary to arrange the device isolation region 53 between the well potential fixing impurity diffusion layer 56 and the impurity diffusion layer 55 for the source and drain. The necessity of arrangement of the device isolation region (S in FIG. 17) leads to an increase in the area of the semiconductor device. The increase in the area is particularly predominant when a plurality of independent wells is arranged. This causes problems in reducing the area of the semiconductor device by changing the vertical MOS transistor from the planar type to the vertical type.

Second, in order to fix the well potential by supplying potential through the contact plug 63, it is necessary to form the well such that the depth (D1 in FIG. 17) of the well is greater than the depth (D2 in FIG. 17) of the device isolation region from the surface of the active region. That is, it is necessary to form the well such that the well is not segmented by the device isolation region. Meanwhile, the depth of the device isolation region is determined depending on the ability for isolation between adjacent MOS transistors, and may not become shallow beyond necessity. For this reason, the well should be formed such that the depth of the well reaches to a position shallower than the bottom of the device isolation region, and undergoes a limitation to the degree of freedom for circuit design. That is, the depth of the well may not be set to be shallower than the depth of the device isolation region, so it is difficult to carry out improvements in the circuit characteristics (suppression of parasitic capacitance) or adjustment.

The invention will be now described herein with reference to illustrative embodiments. Those skilled in the art will recognize that many alternative embodiments can be accomplished using the teaching of the present invention and that the invention is not limited to the embodiments illustrated for explanatory purpose.

In one embodiment, a semiconductor device may include, but is not limited to, a semiconductor substrate; a well of a first conductivity type in the semiconductor substrate; a first element; and a first vertical transistor. The first element supplies potential to the well, the first element being in the well. The first element may include, but is not limited to, a first pillar body of the first conductivity type. The first pillar body has an upper portion that includes a first diffusion layer of the first conductivity type. The first diffusion layer is greater in impurity concentration than the well. The first vertical transistor is in the well. The first vertical transistor may include a second pillar body of the first conductivity type. The second pillar body has an upper portion that includes a second diffusion layer of a second conductivity type.

In some cases, the semiconductor device may further include, but is not limited to, a contact plug connected to the first diffusion layer to fix a potential of the well.

In some cases, the semiconductor device may further include, but is not limited to, an active region in the well, and a third diffusion layer of the second conductivity type on a surface of the active region.

In some cases, the semiconductor device may further include, but is not limited to, a second vertical transistor in the well. The second vertical transistor may include, but is not limited to, a third pillar body of the first conductivity type. The third pillar body has an upper portion that includes a fourth diffusion layer of the second conductivity type.

In some cases, the semiconductor device may further include, but is not limited to, a buried insulating layer in the semiconductor substrate. The buried insulating layer defines an active region in the well. A bottom of the well is deeper than a bottom of the buried insulating layer.

In other cases, the semiconductor device may further include, but is not limited to, a buried insulating layer in the semiconductor substrate. The buried insulating layer defines an active region in the well. A bottom of the well is equal to or shallower than a bottom of the buried insulating layer.

In some cases, the semiconductor substrate may be a silicon-on-insulator substrate which includes an insulating layer and a semiconductor layer on the insulating layer. The semiconductor layer performs as the well.

In some cases, the semiconductor device may further include, but is not limited to, a buried insulating layer in the semiconductor substrate. The buried insulating layer defines an active region in the well. The buried insulating layer contacts with the insulating layer of the silicon-on-insulator substrate.

In another embodiment, a semiconductor device may include, but is not limited to, a semiconductor substrate; a well of a first conductivity type in the semiconductor substrate; a buried insulating layer in the semiconductor substrate; an active region in the well; a first element; and a first vertical transistor. The active region is defined by the buried insulating layer. The first element supplies potential to the well. The first element is in the active region. The first element may include a first pillar body of the first conductivity type. The first pillar body extends upwardly from the well. The first vertical transistor is in the active region. The first vertical transistor may include a second pillar body of the first conductivity type. The second pillar body extends upwardly from the well.

In some cases, the first pillar body may have an upper portion that includes a first diffusion layer of the first conductivity type. The first diffusion layer is greater in impurity concentration than the well. The second pillar body has an upper portion that includes a second diffusion layer of a second conductivity type.

In some cases, the semiconductor device may further include, but is not limited to, a contact plug connected to the first diffusion layer to fix a potential of the well.

In some cases, the semiconductor device may further include, but is not limited to, a third diffusion layer of the second conductivity type on a surface of the active region.

In some cases, the semiconductor device may further include, but is not limited to, a second vertical transistor in the well. The second vertical transistor may include a third pillar body of the first conductivity type. The third pillar body has an upper portion that includes a fourth diffusion layer of the second conductivity type.

In some cases, a bottom of the well may be deeper than a bottom of the buried insulating layer.

In other cases, a bottom of the well may be equal to or shallower than a bottom of the buried insulating layer.

In some cases, the semiconductor substrate may be a silicon-on-insulator substrate which includes an insulating layer and a semiconductor layer on the insulating layer. The semiconductor layer performs as the well.

In some cases, the buried insulating layer contacts with the insulating layer of the silicon-on-insulator substrate.

In still another embodiment, a method of forming a semiconductor device may include, but is not limited to, the following processes. A well of a first conductivity type is formed in a semiconductor substrate. A buried insulating layer is formed in the semiconductor substrate. The buried insulating layer defines an active region in the semiconductor substrate. The well is selectively etched to form a first pillar body of the first conductivity type and a second pillar body of the first conductivity type in the well. A first diffusion layer of the first conductivity type is formed in an upper portion of the first pillar body to form a first element that supplies potential to the well. The first diffusion layer is greater in impurity concentration than the well. A second diffusion layer of a second conductivity type is formed in an upper portion of the second pillar body to form a first vertical transistor in the well.

In some cases, a third diffusion layer of the second conductivity type may be formed on a surface of the active region, except for the first and second pillar bodies, after the first and second pillar bodies are formed.

In some cases, a contact plug is formed which is connected to the first diffusion layer to fix a potential of the well.

Figure 1:
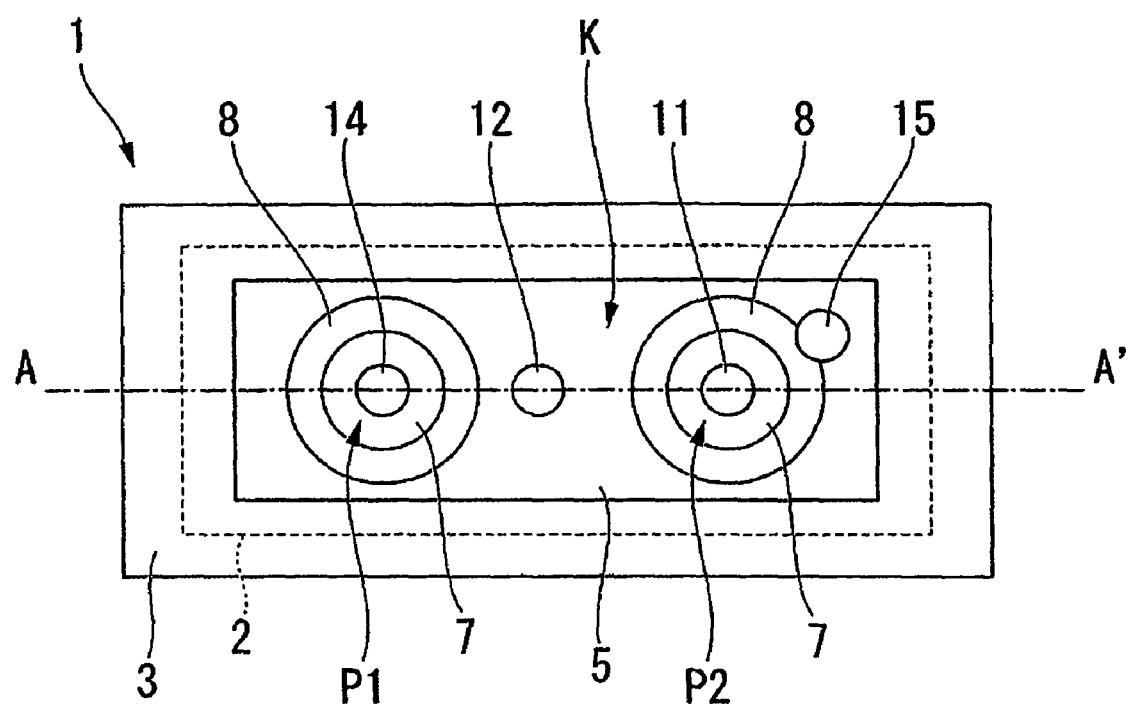
FIG. 1 is a plan view showing the layout of a semiconductor device in accordance with a first embodiment of the present invention.
Figure 2:
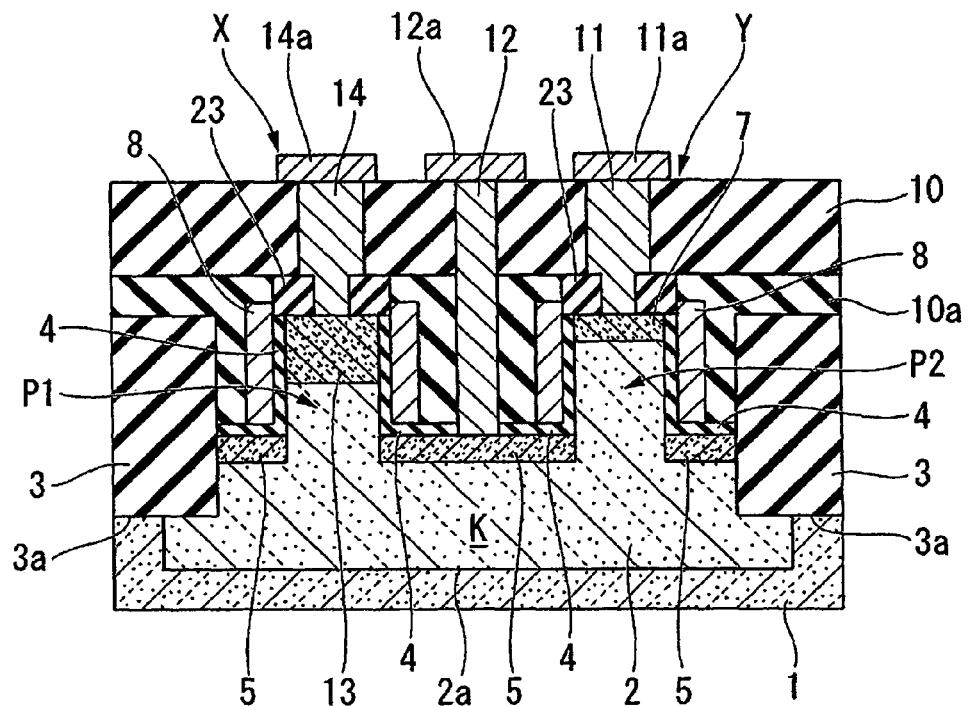
FIG. 2 is a cross sectional view illustrating a semiconductor device, taken along the line A-A' of FIG. 1.

Hereinafter, a semiconductor device according to a first embodiment of the invention will be described in detail with reference to the drawings. FIG. 1 is a plan view showing the layout of the semiconductor device of this embodiment. FIG. 2 is a sectional view taken along the line A-A' of FIG. 1. For simplification, some parts are shown only in FIG. 2, but not shown in the plan view.

In FIGS. 1 and 2, a P-type (second conduction type) semiconductor substrate 1 is prepared. An N-type (first conduction type) well 2 is provided on the semiconductor substrate 1. The N-type well 2 is formed by implanting an N-type impurity into the semiconductor substrate 1 by an ion implantation method. A peripheral part of the N-type well, that is, a boundary part of the N-type well and the semiconductor substrate 1 is provided so as to overlap a buried insulating layer 3 for device isolation.

In the N-type well 2, an active region K is partitioned by the buried insulating layer 3 for device isolation. That is, the buried insulating layer 3 is arranged so as to surround the active region K. The N-type well 2 is formed such that a bottom 2a of the N-type well 2 is located deeper than a bottom 3a of the buried insulating layer 3.

The active region K of the N-type well 2 is provided with a well potential supply device X and a vertical MOS transistor Y. The well potential supply device X is provided with a convex pillar part P1 which becomes the body region of the well potential supply device, and the vertical MOS transistor Y is provided with a convex pillar part P2 which includes the body region forming the channel region of the vertical MOS transistor. The body regions of the pillar part P1 and the pillar part P2 are of the same conduction type as the N-type well 2, that is, of an N type. The concentration of an N-type impurity in the body region may differ from the impurity concentration of the N-type well 2 for adjustment of the threshold voltage of the transistor.

An insulating film 4 is formed on the peripheral surfaces of the pillar part P1 and the pillar part P2 and the surface of the N-type well 2. The insulating film 3 formed on the peripheral surface of the pillar part P2 of the vertical MOS transistor is a gate insulating film 4, and a gate electrode 8 of the vertical MOS transistor is formed on the gate insulating film 4. A sidewall insulating film 23 is arranged so as to surround the peripheral upper surface of the pillar part P2. The gate electrode 8 is connected to a contact plug 15.

A P-type impurity diffusion layer 7 (a second impurity diffusion layer of a second conduction type) and a P-type impurity diffusion layer 5 (a third impurity diffusion layer of a second conduction type) are formed at the upper end of the pillar part P2 of the vertical MOS transistor Y and on the surface of the N-type well 2 in the lower peripheral region with the insulating film 4 interposed between them. The P-type impurity diffusion layers 7 and 5 respectively function as the source and drain of the vertical MOS transistor. Potential is fed from wirings 11a and 12a to the source and drain through a contact plug 11 and a contact plug 12, respectively.

A gate electrode 8 of the well potential supply device is formed on the peripheral surface of the pillar part P1 of the well potential supply device X with the insulating film 4 interposed between them. The gate electrode 8 of the pillar part P1 of the well potential supply device is formed so as to surround the peripheral upper surface of the pillar part P1 with a sidewall insulating film 23 interposed between them. Potential is supplied from a wiring 14a connected to a contact plug 14 to the N-type well 2 through the pillar part P1 as the well potential supply, and thus the N-type well 2 is fixed at a predetermined potential.

An N-type impurity diffusion layer 13 (a first impurity diffusion layer of a first conduction type) connected to the contact plug 14 is formed at the upper end of the pillar part P1 of the well potential supply device, and a P-type impurity diffusion layer 5 is formed on the surface of the N-type well 2 in the lower peripheral region of the pillar part P1 with the insulating film 4 interposed between them. The N-type impurity diffusion layer 13 has a concentration which is required for reducing contact resistance to the contact plug 14 and is higher than the concentration of the N-type well 2.

As shown in FIG. 2, in the semiconductor device of this embodiment, the contact plug 14 for supplying potential to the N-type well 2 is connected to the upper surface of the N-type well 2 through the pillar part P1. With this structure, the N-type impurity diffusion layer 13 which has the same conduction type as the N-type well 2 and has a concentration necessary for reducing contact resistance to the contact plug 14 can be formed at the upper part of the pillar part P1. The N-type impurity diffusion layer 13 and the P-type impurity diffusion layer 5 can be arranged in a state of being easily isolated from each other by adjustment of ion implantation energy in forming the N-type impurity diffusion layer 13. Thus, it is not necessary to arrange the buried insulating film 3 for device isolation between the pillar part P1 of the well potential supply device X and the pillar part P2 of the vertical MOS transistor Y. Therefore, the area for arrangement of the buried insulating film 3 for device isolation can be reduced, and as a result, high integration of the semiconductor device can be achieved.

Figure 3:
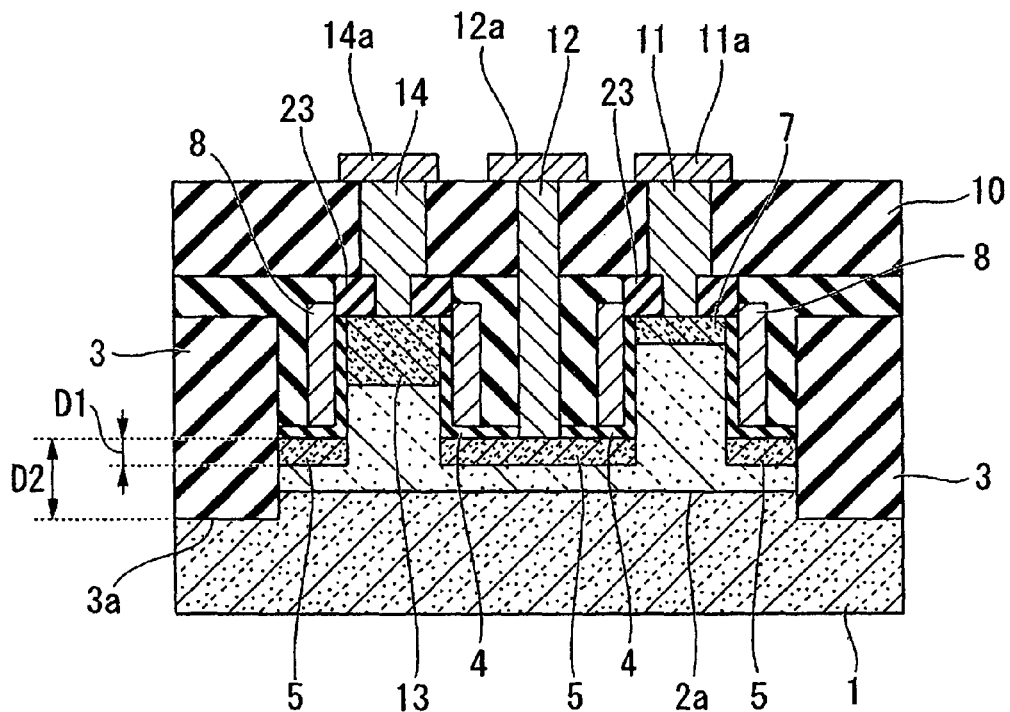
FIG. 3 is a cross sectional view showing a semiconductor device where a depth of an n-well from a silicon surface is shallower than a depth of a buried insulating layer for device isolation in accordance with the first embodiment of the present invention.

It is not necessary to provide the buried insulating film 3 for device isolation in the N-type well 2, such that, as shown in FIG. 3, the depth D1 of the N-type well 2 from the active region surface (silicon surface) can be set so as to be smaller than the depth D2 of the buried insulating film 3. That is, the bottom 2a of the N-type well 2 may be shallower than the bottom 3a of the buried insulating film 3. Even if the depth D1 of the N-type well 2 is set so as to be smaller than the depth D2 of the buried insulating film 3, there is no case where the N-type well 2 is segmented by the buried insulating film 3.

Therefore, the depth of the N-type well 2 can be freely set such that the semiconductor device has the desired electrical characteristics, and adjustment and design for the desired electrical characteristics are facilitated.

In addition, in forming a deep N-type well 2, it is necessary to perform ion implantation multiple times while changing energy. In the case of a shallow N-type well 2, the number of ion implantations can be reduced, and as a result, manufacturing costs can be reduced.

As described above, according to this embodiment, the potential of the N-type well 2 is fixed through the pillar part P1 of the well potential supply device X, such that the depth of the N-type well 2 can be freely set.

Although in the foregoing embodiment, a case where an N-type well is formed has been described, the invention may be applied to a P-type well.

In arranging an N-type vertical MOS transistor in a P-type well, it is preferable to implant a P-type impurity having the same conduction type as the P-type well into the upper part of the pillar part of the well potential supply device connected to the P-type well with a high concentration. An N-type impurity may be implanted into the upper part and lower peripheral region of the pillar part of the vertical MOS transistor so as to form the source and drain. Even if an N-type well and a P-type well are formed on a single semiconductor substrate in the CMOS configuration, the potential supply method to the well according to the embodiment of the invention may be applied to both the N-type well and the P-type well. The planar shapes of the pillar parts, the arrangement positions of the contact plugs connected to the pillar parts, the connection structures of the pillar parts and the contact plugs, and the like are just an example, and may be modified without departing from the scope of the invention.

In forming N-type and P-type vertical MOS transistors for the CMOS configuration, the N-type impurity diffusion layer 13 of the pillar part P1 of the well potential supply device may be formed at the same time the N-type impurity diffusion layer is formed as a source electrode and a drain electrode at the upper part of the pillar part for the N-type vertical MOS transistor.

Figure 4:
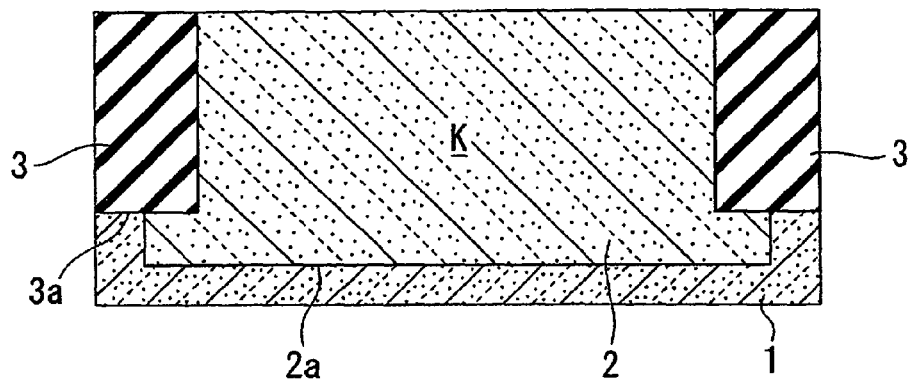
FIG. 4 is a fragmentary cross sectional elevation view illustrating a step involved in a method of forming a semiconductor device in accordance with the first embodiment of the present invention.

Next, a method of manufacturing a semiconductor device of this embodiment will be described with reference to FIGS. 4 to 11. In FIG. 4, an N-type impurity, such as phosphorus, is implanted into the P-type semiconductor substrate 1 made of silicon by ion implantation to form the N-type well 2. Next, the buried insulating film 3 for device isolation which partitions the active region K is formed by filling an insulating layer, such as silicon oxide, in a groove patterned so as to surround the active region K by using an STI (Shallow Trench Isolation) method. The bottom 2a of the N-type well 2 is formed to be deeper than the bottom 3a of the buried insulating film 3. The buried insulating film 3 may be formed earlier than the N-type well 2. For adjustment of the threshold voltage of the transistor, ion implantation may be carried out for the convex portion of the N-type well 2 (the region corresponding to the pillar part) in advance to adjust the concentration of the N-type impurity.

Figure 5:
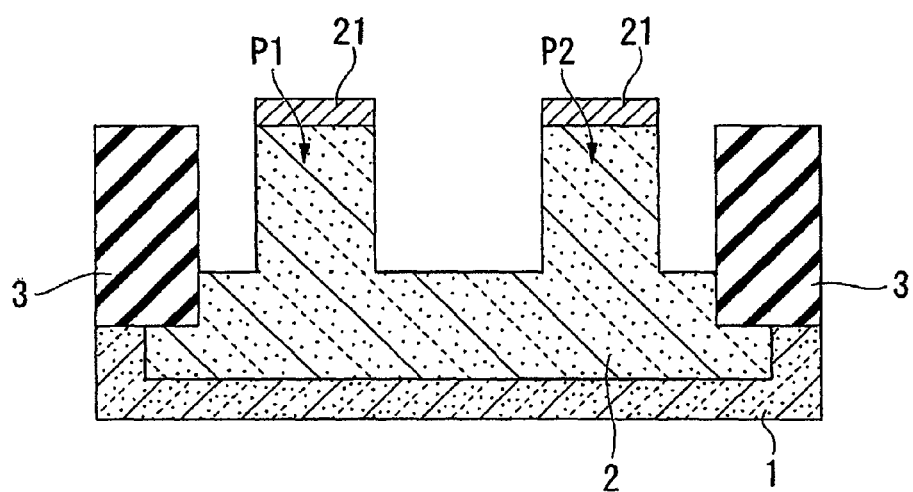
FIG. 5 is a fragmentary cross sectional elevation view illustrating a step subsequent to the step of FIG. 4, involved in a method of forming the semiconductor device in accordance with the first embodiment of the present invention.

In FIG. 5, a mask pattern for pillar part forming is formed on the N-type well 2 by using a silicon nitride film 21, and silicon is subjected to dry etching with the silicon nitride film 21 as a mask, thereby forming the pillar part P1 and the pillar part P2. The pillar part P1 and the pillar part P2 may be different in the planar shape, that is, may be different in the diameter. In order to protect the upper surface of the buried insulating film 3 for device isolation, in a state where the buried insulating film 3 is covered with the pattern of the silicon nitride film 21 for a mask, silicon may be subjected to dry etching.

Figure 6:
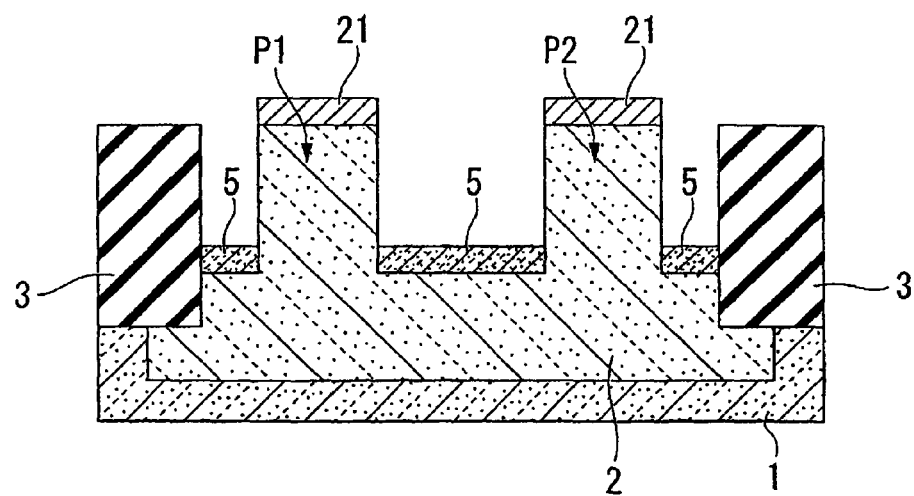
FIG. 6 is a fragmentary cross sectional elevation view illustrating a step subsequent to the step of FIG. 5, involved in a method of forming the semiconductor device in accordance with the first embodiment of the present invention.

In FIG. 6, a P-type impurity, such as boron fluoride, is implanted into the silicon surface of the semiconductor substrate 1 by an ion implantation method with the mask pattern of the silicon nitride film 21 of FIG. 5 as a mask to form the P-type impurity diffusion layer 5. The impurity diffusion layer 5 is formed on the surface of the active region K excluding the pillar part P1 and the pillar part P2 inside the region of the N-type well 2.

Figure 7:
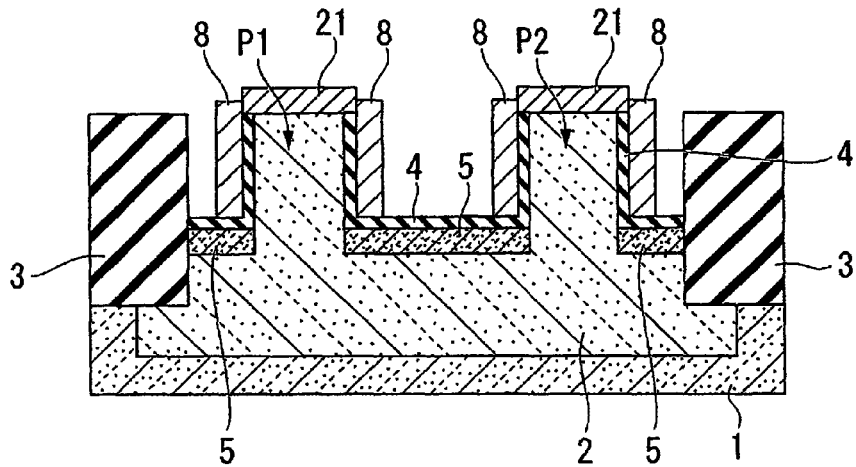
FIG. 7 is a fragmentary cross sectional elevation view illustrating a step subsequent to the step of FIG. 6, involved in a method of forming the semiconductor device in accordance with the first embodiment of the present invention.

In FIG. 7, thermal oxidization is carried out to form the insulating film 4 as a thermally oxidized film on the side surfaces of the pillar part P1 and the pillar part P2 and the silicon surface of the semiconductor substrate 1. Thereafter, an impurity-doped polysilicon or high-melting-point metal film is deposited on the insulating film 4 of the pillar parts P1 and P2, and then dry etching is carried out until the surface of the insulating film 4 is exposed. The sidewall-shaped gate electrodes 8 are formed at the peripheral portions on the side surfaces of the pillar parts P1 and P2. A gate electrode material remains at the sidewall part of the buried insulating film 3 for device isolation in the shape of a sidewall, but not shown in the drawing.

Figure 8:
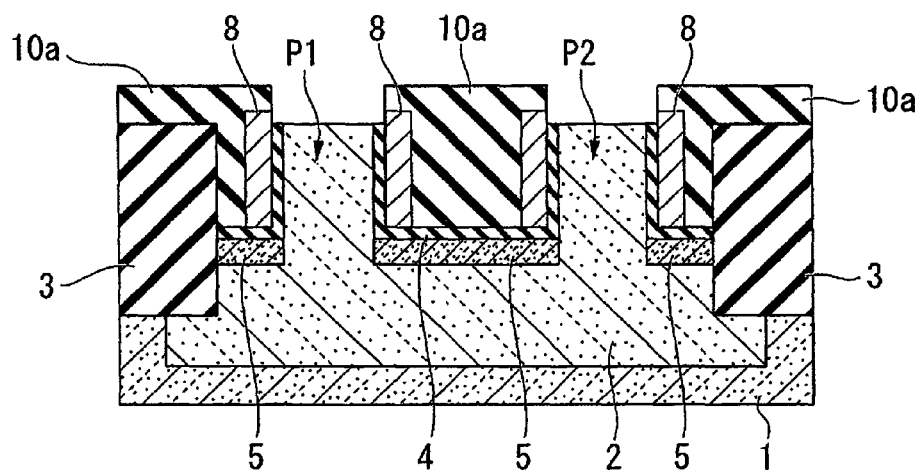
FIG. 8 is a fragmentary cross sectional elevation view illustrating a step subsequent to the step of FIG. 7, involved in a method of forming the semiconductor device in accordance with the first embodiment of the present invention.

In FIG. 8, an insulating film, such as a silicon oxide film, is deposited between the sidewall-shaped gate electrodes 8 on the side surfaces of the pillar parts P1 and P2 to form a first insulating interlayer 10a, and the surface of the first insulating interlayer 10a is polished and planarized by a CMP (Chemical Mechanical Polishing) method until the upper surface of the silicon nitride film 21 is exposed. Thereafter, wet etching is carried out to remove the silicon nitride film 21 for a mask, such that the upper surfaces (silicon surfaces) of the pillar parts P1 and P2 are exposed.

Figure 9:
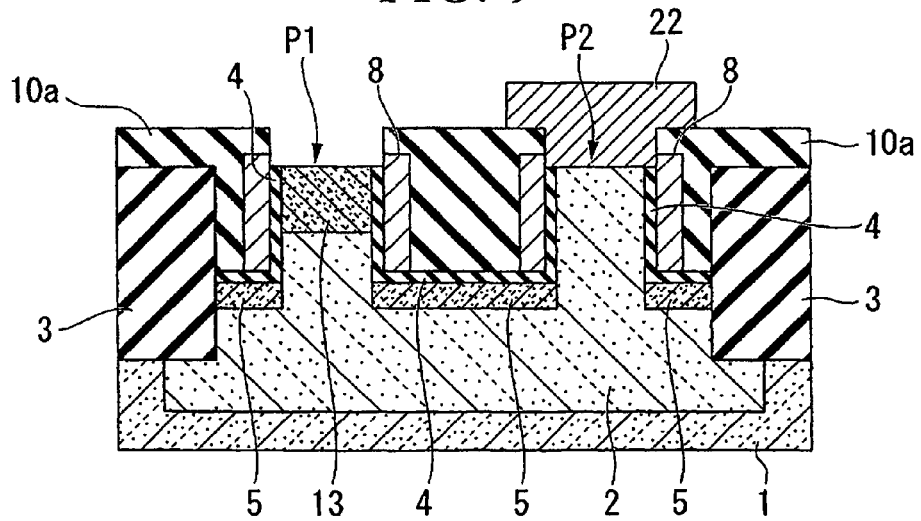
FIG. 9 is a fragmentary cross sectional elevation view illustrating a step subsequent to the step of FIG. 8, involved in a method of forming the semiconductor device in accordance with the first embodiment of the present invention.

In FIG. 9, a mask pattern of a photoresist film 22 is formed so as to cover the upper surface of the pillar part P2 of the vertical MOS transistor. An N-type impurity, such as phosphorous, is ion-implanted into the upper part of the pillar part P1 of the well potential supply device with the mask pattern as a mask to form the N-type impurity diffusion layer 13. After the N-type impurity diffusion layer 13 is formed, the photoresist film 22 for a mask is removed.

The pillar part P1 of the well potential supply device does not carry out the vertical MOS transistor operation, so from a viewpoint of reduction in electrical resistance, it is preferable that the N-type impurity diffusion layer 13 is formed at a depth so as not to be in contact with the P-type impurity diffusion layer 5. When the N-type impurity diffusion layer 13 of the pillar part P1 of the well potential supply device is formed independently, it is preferable to set the depth such that ion implantation energy is optimized.

Figure 10:
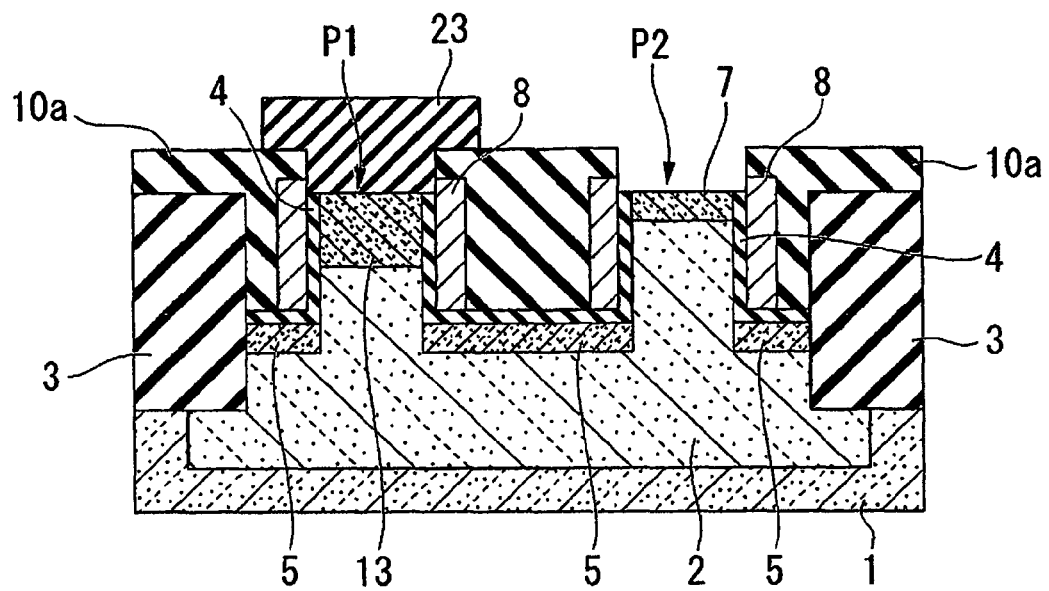
FIG. 10 is a fragmentary cross sectional elevation view illustrating a step subsequent to the step of FIG. 9, involved in a method of forming the semiconductor device in accordance with the first embodiment of the present invention.

In FIG. 10, a mask pattern of a photoresist film 23 is formed so as to cover the upper surface of the pillar part P1 of the well potential supply device. A P-type impurity, such as boron fluoride, is ion-implanted into the upper part of the pillar part P2 of the vertical MOS transistor with the mask pattern as a mask to form the P-type impurity diffusion layer 7. It is preferable that the depth of the P-type impurity diffusion layer 7 is optimized in terms of desired transistor characteristics. After the P-type impurity diffusion layer 7 is formed, the photoresist film 23 for a mask is removed.

Figure 11:
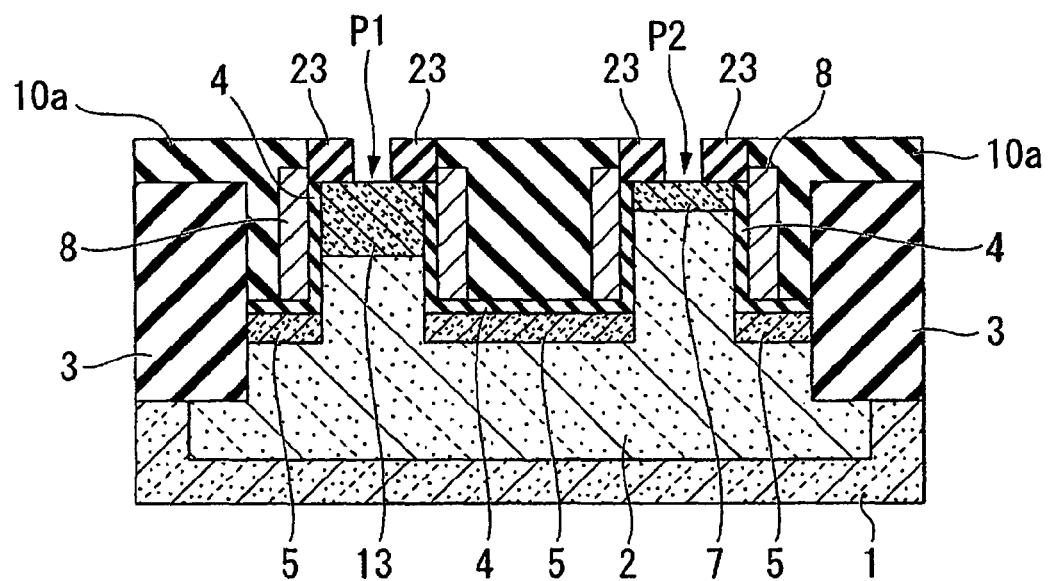
FIG. 11 is a fragmentary cross sectional elevation view illustrating a step subsequent to the step of FIG. 10, involved in a method of forming the semiconductor device in accordance with the first embodiment of the present invention.

In FIG. 11, a silicon nitride film is deposited on the impurity diffusion layers 7 and 13 of the pillar part P1 and the pillar part P2, and dry etching is carried out to form the sidewall insulating film 23. The sidewall insulating film 23 is formed at the inner-wall part of the opening of the first insulating interlayer 10a which is formed to have the same shape as the external shapes of the pillar part P1 and the pillar part P2. The silicon surfaces near the centers of the upper surfaces of the pillar part P1 and the pillar part P2 are exposed.

Figure 12:
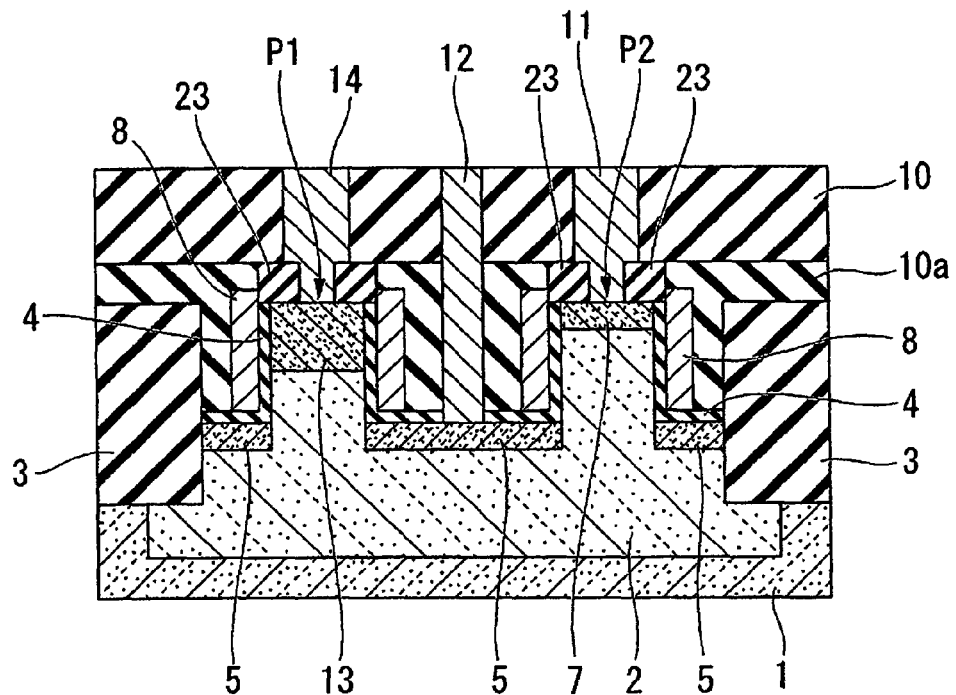
FIG. 12 is a fragmentary cross sectional elevation view illustrating a step subsequent to the step of FIG. 11, involved in a method of forming the semiconductor device in accordance with the first embodiment of the present invention.

In FIG. 12, an insulating film, such as a silicon oxide film, is deposited on the first insulating interlayer 10a to form a second insulating interlayer 10, and the surface of the second insulating interlayer 10 is polished and planarized by a CMP (Chemical Mechanical Polishing) method. Next, through holes are provided in the second insulating interlayer 10, and the contact plugs 14 and 11 are formed of polysilicon or metal films, such as tungsten (W), so as to be respectively connected to the upper surfaces of the impurity diffusion layers 13 and 7 of the pillar part P1 and the pillar part P2. In this case, the sidewall insulating film 23 is used as an etching stopper in forming the contact plugs, such that the insulation between the contact plugs 11 and 14 and the gate electrodes 8 can be ensured.

Thereafter, as shown in FIG. 1, the contact plug 15 is formed to be connected to the gate electrode 8.

As shown in FIG. 2, the contact plug 12 is formed to be connected to the P-type impurity diffusion layer 5. The contact plugs 11, 12, and 14 may be formed simultaneously. It is not necessary to provide a contact plug, which is connected to the gate electrode 8, at the pillar part P1 of the well potential supply device. Thereafter, wire layers 11a, 12a, and 14a which are respectively connected to the contact plugs are formed of aluminum (Al) or copper (Cu) to complete a semiconductor device.

Figure 13:
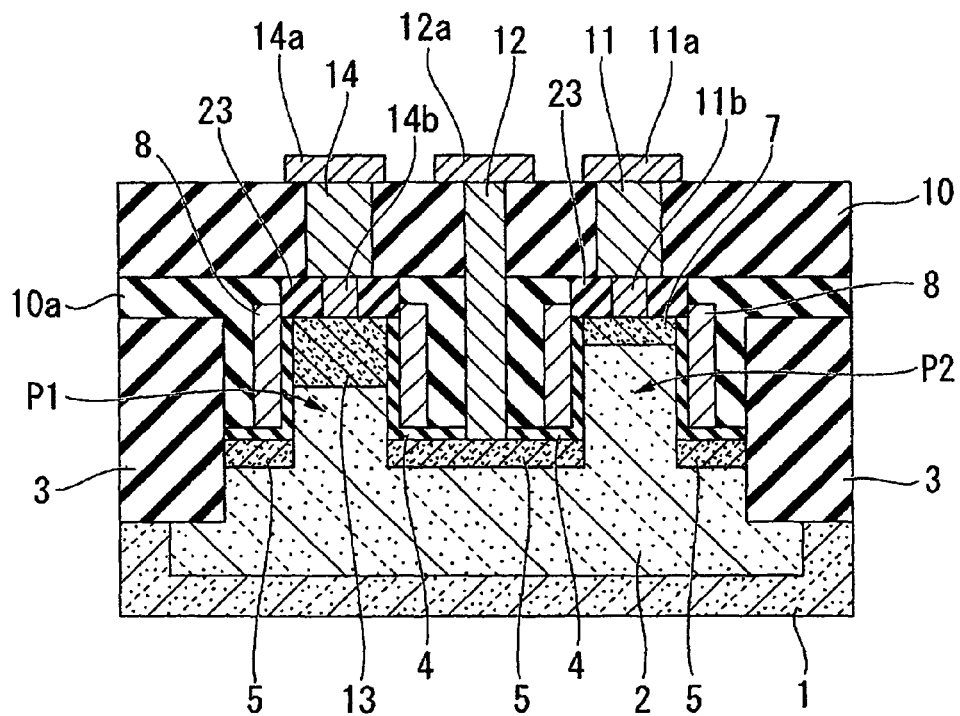
FIG. 13 is a fragmentary cross sectional elevation view illustrating a step subsequent to the step of FIG. 12, involved in a method of forming the semiconductor device in accordance with the first embodiment of the present invention.

In FIG. 13, silicon may be subjected to selective epitaxial growth in a state where only the portions near the centers of the upper surfaces of the pillar part P1 and the pillar part P2 of FIG. 10 are exposed, and contact plugs 11b and 14b may be formed at the opening of the first insulating interlayer 10a in advance. In this case, the position of the contact plug 11 connected to the pillar part P2 of the vertical MOS transistor may be shifted from the center of the pillar part P2. Therefore, the position of the contact plug 11 is shifted in a direction away from contact plug 13 connected to the gate electrode 8, such that the distance between the contact plugs is widened and manufacturing is facilitated.

Next, a second embodiment of the invention will be described. In the second embodiment, a semiconductor device is formed on an SOI (Silicon On Insulator) semiconductor substrate.

Figure 14:
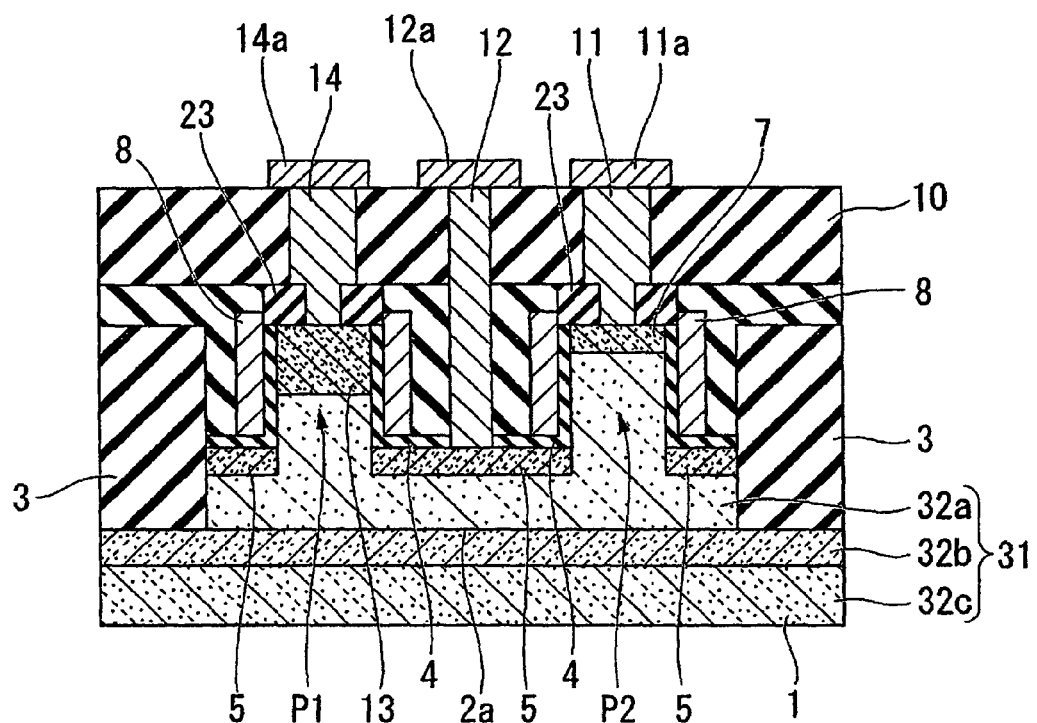
FIG. 14 is a fragmentary cross sectional elevation view illustrating a semiconductor device having a silicon-on-insulator (SOI) structure.

Reference numerals other than an SOI substrate are the same as those described in the first embodiment. FIG. 14 is a sectional view of an SOI (Silicon On Insulator) semiconductor. An SOI substrate 31 is prepared. The SOI substrate 31 includes an underlying support substrate 32c, an intermediate insulating layer 32b, and an overlying semiconductor layer 32a. In forming a semiconductor device on an SOI substrate, when the semiconductor layer 32a has a small thickness, the buried insulating film 3 for device isolation may be in contact with the insulating layer 32b. A well 2a is formed in the semiconductor layer 32a surrounded by the buried insulating film 3 and the insulating layer 32a. In such a case, when the known potential supply method to the well is applied, it is impossible to fix the well potential.

In contrast, according to this embodiment, a potential can be applied to the well 2a through the pillar part P1 of the well potential supply device. Therefore, it is possible to easily avoid the well 2a from being in the floating state, and thus a high-performance semiconductor device can be manufactured.

Next, a third embodiment of the invention will be described. In this embodiment, two or more of pillar parts P1 of the potential supply device and pillar parts P2 of the vertical MOS transistor are arranged in the active region K.

Figure 15:
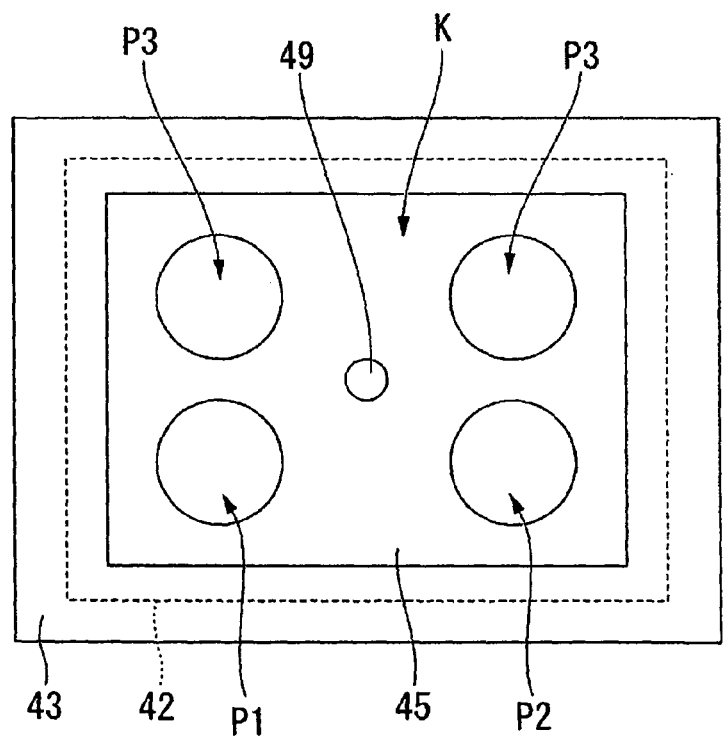
FIG. 15 is a plan view showing a case where three vertical MOS transistors with one of the source and drain regions connected in common are arranged in the active region.

FIG. 15 is a plan view showing a case where three vertical MOS transistors with one of the source and drain regions connected in common are arranged in the active region K. In the drawing, only the positions of the pillar parts are shown, but the gate electrodes and the like are not shown.

A buried insulating film 43 for device isolation is arranged so as to surround the active region K. A peripheral part of an N-type well 42. P1 is a pillar part of a potential supply device for fixing the well potential. The pillar part is connected to a well part 42 with the same structure as described above. An impurity diffusion layer 45 of an opposite conduction type to the well part 42 is formed on the surface of the active region K other than the regions where the pillar parts P1 to P4 are formed. The vertical MOS transistors have a common source and a common drain. Potential is fed to the source and drain through a contact plug 49 which is connected to the impurity diffusion layer 45.

Even if a plurality of vertical MOS transistors is arranged in such a manner, the invention is applied, such that high integration can be achieved. The number of pillar parts of the well potential supply device is not limited to one. A plurality of pillar parts of well potential supply devices may be arranged in a single well.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device comprising:
    a semiconductor substrate;
    a well of a first conductivity type in the semiconductor substrate;
    a first element that supplies potential to the well, the first element being in the well, the first element comprising a first pillar body of the first conductivity type, the first pillar body having an upper portion that includes a first diffusion layer of the first conductivity type, the first diffusion layer being greater in impurity concentration than the well; and
    a first vertical transistor in the well, the first vertical transistor comprising a second pillar body of the first conductivity type, the second pillar body having an upper portion that includes a second diffusion layer of a second conductivity type.

2. The semiconductor device according to claim 1, further comprising:
    a contact plug connected to the first diffusion layer to fix a potential of the well.

3. The semiconductor device according to claim 1, further comprising:
    an active region in the well; and
    a third diffusion layer of the second conductivity type on a surface of the active region.

4. The semiconductor device according to claim 1, further comprising:
    a second vertical transistor in the well, the second vertical transistor comprising a third pillar body of the first conductivity type, the third pillar body having an upper portion that includes a fourth diffusion layer of the second conductivity type.

5. The semiconductor device according to claim 1, further comprising:
    a buried insulating layer in the semiconductor substrate, the buried insulating layer defining an active region in the well,
    wherein a bottom of the well is deeper than a bottom of the buried insulating layer.

6. The semiconductor device according to claim 1, further comprising:
    a buried insulating layer in the semiconductor substrate, the buried insulating layer defining an active region in the well,
    wherein a bottom of the well is equal to or shallower than a bottom of the buried insulating layer.

7. The semiconductor device according to claim 1, further comprising a buried insulating layer in the semiconductor substrate, the buried insulating layer defining an active region in the well.

8. The semiconductor device according to claim 1, wherein the semiconductor substrate comprises:
    an insulating layer; and
    a buried insulating layer defining an active region in the well, the buried insulating layer contacting with the insulating layer.

9. The semiconductor device according to claim 1, wherein the well is devoid of segmentation by a device isolation region.

10. The semiconductor device according to claim 1, wherein the semiconductor substrate is a silicon-on-insulator substrate which includes an insulating layer and a semiconductor layer on the insulating layer, the semiconductor layer performs as the well.

11. The semiconductor device according to claim 10, further comprising: a buried insulating layer in the semiconductor substrate, the buried insulating layer defining an active region in the well, the buried insulating layer contacting with the insulating layer of the silicon-on-insulator substrate.

12. A semiconductor device comprising:
    a semiconductor substrate;
    a well of a first conductivity type in the semiconductor substrate;
    a buried insulating layer in the semiconductor substrate;
    an active region in the well, the active region being defined by the buried insulating layer;
    a first element that supplies potential to the well, the first element being in the active region, the first element comprising a first pillar body of the first conductivity type, the first pillar body extending upwardly from the well; and
    a first vertical transistor in the active region, the first vertical transistor comprising a second pillar body of the first conductivity type, the second pillar body extending upwardly from the well.

13. The semiconductor device according to claim 12, wherein the first pillar body has an upper portion that includes a first diffusion layer of the first conductivity type, the first diffusion layer being greater in impurity concentration than the well, the second pillar body has an upper portion that includes a second diffusion layer of a second conductivity type.

14. The semiconductor device according to claim 12, further comprising:
  a contact plug connected to the first diffusion layer to fix a potential of the well.

15. The semiconductor device according to claim 12, further comprising:
  a third diffusion layer of the second conductivity type on a surface of the active region.

16. The semiconductor device according to claim 12, further comprising:
  a second vertical transistor in the well, the second vertical transistor comprising a third pillar body of the first conductivity type, the third pillar body having an upper portion that includes a fourth diffusion layer of the second conductivity type.

17. The semiconductor device according to claim 12, wherein a bottom of the well is deeper than a bottom of the buried insulating layer.

18. The semiconductor device according to claim 12, wherein a bottom of the well is equal to or shallower than a bottom of the buried insulating layer.

19. The semiconductor device according to claim 12, wherein the semiconductor substrate is a silicon-on-insulator substrate which includes an insulating layer and a semiconductor layer on the insulating layer, the semiconductor layer performs as the well.

20. The semiconductor device according to claim 19, wherein the buried insulating layer contacts with the insulating layer of the silicon-on-insulator substrate.

\* \* \* \* \*